United States Patent
Barbarossa et al.

(10) Patent No.: US 10,186,833 B2
(45) Date of Patent: Jan. 22, 2019

(54) DENSELY-SPACED LASER DIODE CONFIGURATIONS

(71) Applicant: II-VI Incorporated, Saxonburg, PA (US)

(72) Inventors: Giovanni Barbarossa, Saratoga, CA (US); Norbert Lichtenstein, Langnau am Albis (CH)

(73) Assignee: II-VI Incorporated, Saxonburg ( * ) Notice: Subject to any disclaimer, the term of this patent is extended or adjusted under 35 U.S.C. 154(b) by 63 days.

(21) Appl. No.: 15/041,587

(22) Filed: Feb. 11, 2016

(65) Prior Publication Data

US 2016/0240999 A1 Aug. 18, 2016

Related U.S. Application Data

(60) Provisional application No. 62/117,607, filed on Feb. 18, 2015.

(51) Int. Cl.
| | |
|---|---|
| *H01S 5/026* | (2006.01) |
| *H01L 21/78* | (2006.01) |
| *H01S 5/00* | (2006.01) |
| *H01S 5/022* | (2006.01) |
| *H01S 5/40* | (2006.01) |
| *H01S 5/024* | (2006.01) |
| *H01S 5/02* | (2006.01) |

(52) U.S. Cl.
CPC ...... *H01S 5/02236* (2013.01); *H01S 5/02252* (2013.01); *H01S 5/4031* (2013.01); *H01S 5/0201* (2013.01); *H01S 5/0215* (2013.01); *H01S 5/0224* (2013.01); *H01S 5/02272* (2013.01); *H01S 5/02469* (2013.01)

(58) Field of Classification Search
CPC ............... H01S 5/02252; H01S 5/0224
USPC .................................................. 372/50.12
See application file for complete search history.

(56) References Cited

U.S. PATENT DOCUMENTS

| | | | |
|---|---|---|---|
| 5,848,083 A | 12/1998 | Haden et al. | |
| 5,920,584 A | 7/1999 | Dohle et al. | |
| 6,100,104 A * | 8/2000 | Haerle | H01L 33/007 |
| | | | 438/113 |
| 6,178,189 B1 | 1/2001 | Srinivasan et al. | |
| 6,993,055 B2 * | 1/2006 | Wang | B82Y 20/00 |
| | | | 372/46.013 |
| 7,864,825 B2 | 1/2011 | Thiagarajan et al. | |
| 8,068,524 B1 | 11/2011 | Patel et al. | |
| 8,101,446 B2 | 1/2012 | Sebastian et al. | |
| 8,320,419 B2 * | 11/2012 | Krejci | H01S 5/02272 |
| | | | 372/50.12 |
| 8,518,814 B2 | 8/2013 | Stephens, IV et al. | |

(Continued)

*Primary Examiner* — Tuan Nguyen
(74) *Attorney, Agent, or Firm* — Wendy W. Koba (57) ABSTRACT

A densely-spaced single-emitter laser diode configuration is created by using a laser bar (or similar array configuration) attached to a submount component of a size sufficient to adequately support the enter laser structure. The surface of the submount component upon which the laser structure is attached is metallized and used to form the individual electrical contacts to the laser diodes within the integrated laser structure. Once attached to each other, the laser structure is singulated by creating vertical separations between adjacent light emission areas. The submount metallization is similarly segmented, creating separate electrodes that are used to individually energize their associated laser diodes.

19 Claims, 5 Drawing Sheets

(56) References Cited

U.S. PATENT DOCUMENTS

| | | |
|---|---|---|
| 2002/0172244 A1 | 11/2002 | Li et al. |
| 2006/0093000 A1* | 5/2006 | Nam .................... H01S 5/4031 |
| | | 372/43.01 |
| 2009/0104727 A1* | 4/2009 | Krejci ................ H01S 5/02272 |
| | | 438/46 |
| 2010/0124246 A1* | 5/2010 | Lutgen ................ H01L 33/0095 |
| | | 372/50.1 |
| 2013/0092722 A1 | 4/2013 | Krejci et al. |
| 2013/0270232 A1 | 10/2013 | Shimazawa et al. |
| 2014/0086539 A1 | 3/2014 | Goutain et al. |
| 2014/0299981 A1* | 10/2014 | Goh ........................ H01L 21/78 |
| | | 257/712 |

* cited by examiner

DENSELY-SPACED LASER DIODE CONFIGURATIONS

CROSS-REFERENCE TO RELATED APPLICATIONS

This application claims the benefit of U.S. Provisional Application Ser. No. 62/117,607, filed Feb. 18, 2015 and herein incorporated by reference.

TECHNICAL FIELD

The present invention relates to single-emitter laser diode configurations and, more particularly, to densely-spaced arrangements of single-emitter laser diodes.

BACKGROUND OF THE INVENTION

In the design and implementation of various types of optical systems, arrangements where single-emitter laser diodes are mounted on individual dielectric heatsinks ("submounts") and electrically driven in series are well known. In the interest of creating ever-more complex optical systems with higher degrees of integration, it will be preferable to place these single-emitter laser diodes as close to each other as possible, while maintaining optical alignment of their emitter regions and retaining the ability to individually control each separate device. Thus, at higher levels of integration the need to individually place each laser diode on its associated, individual submount becomes problematic. In densely-spaced arrangements, this type of individual placement will inevitably result in alignment errors of the emitter area of one laser diode relative to the others.

Additional problems that arise in attempting to form densely-spaced laser diode arrangements are associated with the specific sequence of fabrication steps used to form the final product. That is, later fabrication processes that raise the temperature of the laser-submount combination may result in previously-aligned laser-submount elements becoming misaligned. This may occur, for example, when a high-temperature process causes the laser-submount bonding material to "reflow" and create misalignment.

SUMMARY OF THE INVENTION

The needs remaining in the prior art are addressed by the present invention, which relates to single-emitter laser diode configurations and, more particularly, to densely-spaced arrangements of single-emitter laser diodes.

In accordance with the present invention, an integrated laser structure fabricated to include a plurality of separate light emission areas (e.g., laser bar, wafer-based laser structure) is attached to a submount component of a size sufficient to adequately support the enter laser structure. The surface of the submount component upon which the laser structure is attached is metallized and used to form the individual electrical contacts to the laser diodes within the integrated laser structure. Once attached to each other, the laser structure is singulated by creating vertical separations between adjacent light emission areas. The submount metallization is similarly segmented, creating separate electrodes that are used to individually energize their associated laser diodes.

In a preferred embodiment, the submount is formed of a dielectric material with a coefficient of thermal expansion (CTE) similar to that of the laser structure itself (e.g., GaAs other appropriate material).

The bonding of the laser structure to the submount may be provided by (for example) gluing, brazing or soldering the two components together. As long as an acceptable path for thermal and electrical conduction (as well as mechanical stability) is provided, any desired arrangement may be used. The singulation may be performed by any suitable technique for creating trenches through the integrated laser structure, including (but not limited to) sawing, laser cutting, etching, or the like.

An exemplary embodiment of the present invention takes the form of an optical system including densely-spaced light sources, the system comprising a plurality of separate single-emitter laser diodes and a submount comprising a substrate of heatsinking material and a plurality of separate metallization regions disposed in a densely-spaced configuration along a top surface of the substrate. The plurality of separate single-emitter laser diodes are fabricated as an integral structure where the light emission areas of the diodes are aligned in an array configuration. After attaching the laser structure to the submount, a singulation process is performed to create spaces (trenches) between adjacent single-emitter laser diodes (as well as spaces between metallization regions), thereby forming the densely-spaced configuration.

Another embodiment of the present invention takes the form of a method of forming a plurality of densely-spaced single-emitter laser diodes supported by a single submount, comprising the steps of: (1) providing an integrated laser structure including an array of light emission areas associated with an array of laser diodes; (2) providing a heatsinking submount including a top metallization contact layer; (3) attaching the integrated laser structure to the heatsinking submount; and (4) singulating the arrangement created in step 3) to separate the light emission areas and for the plurality of densely-spaced single-emitter laser diodes.

Other and further embodiments and aspects of the present invention will become apparent during the course of the following discussion as well as by reference to the drawings.

BRIEF DESCRIPTION OF THE DRAWINGS

Referring now to the drawings, where like numerals represent like parts in several views.

DETAILED DESCRIPTION

Figure 1:
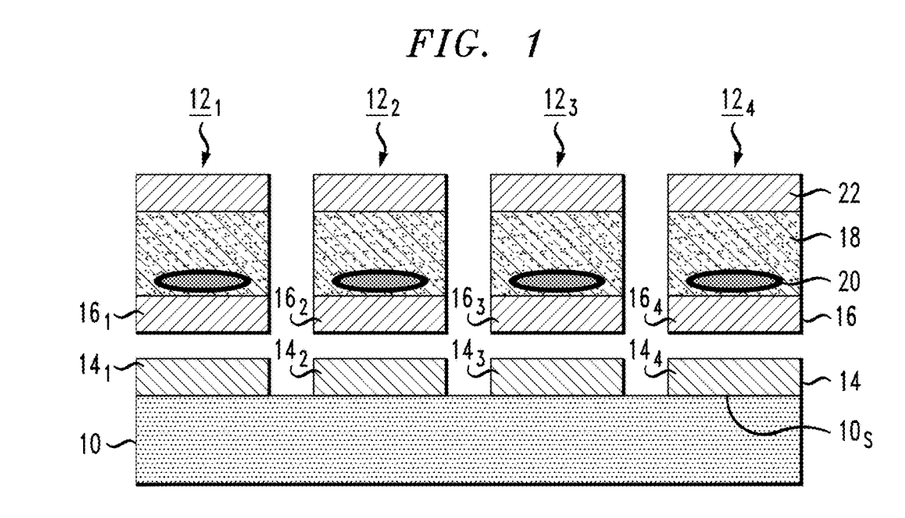
FIG. 1 illustrates an exemplary arrangement for attaching a plurality of separate single-emitter laser diodes to a common submount.
Figure 2:
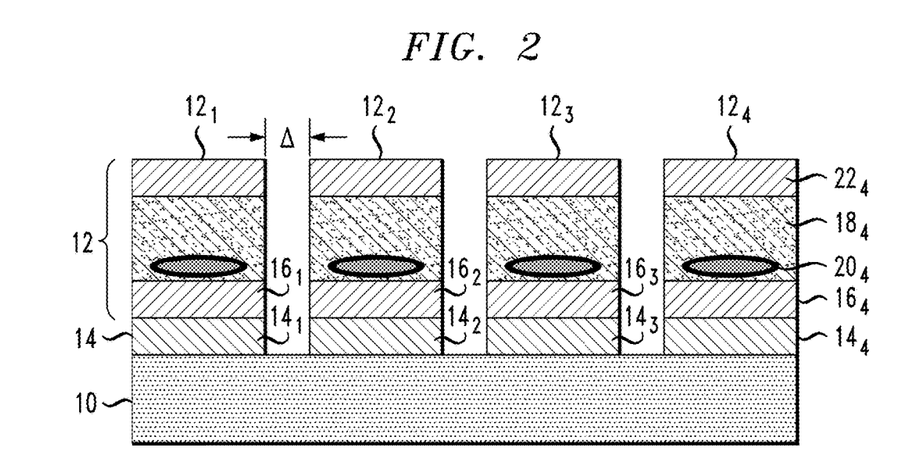
FIG. 2 shows the same configuration as FIG. 1, with the separate laser diodes shown as attached to separate electrodes formed on the surface of the common submount.

A first embodiment of the present invention is shown in FIGS. 1 and 2. In this embodiment, a single substrate 10 is used as a dielectric submount to support a plurality of individual, single-emitter laser diodes $12_1$-$12_4$. Preferably, submount 10 is formed of a material with a CTE similar to that of the semiconductor material used in the fabrication of laser diodes 12. For example, when using GaAs-based laser diodes (GaAs having a CTE of about $5.7 \times 10^{-6}$), a good choice for the submount material would be $Cu_{20}W$ (having a CTE of about $8.3 \times 10^{-6}$).

A metallization layer 14 is formed on top surface 10S of submount 10 and used to provide electrical input to laser diodes 12. Each of the individual laser diodes $12_i$ is shown as comprising a "top" metallization layer $16_i$, a semiconductor layer $18_i$ (including a light emission area $20_i$), and a "bottom" metallization layer $22_i$. The designations of "top" and "bottom" are associated with the location of light emission area 20 within semiconductor layer 18.

In a preferred arrangement of this embodiment, metallization layer 14 is formed as a pattern of individual metallized contact areas $14_i$ (hereinafter referred to as "electrodes") that correspond to the number and arrangement of the plurality of individual laser diodes $12_i$ on submount 10. The patterned layer may be formed using any of the various integrated circuit fabrication techniques used to form such contact pads. The use of individual contact areas (electrically isolated from each other) allows for each of the individual laser diodes $12_i$ to be separately energized and individually controlled in the manner required for systems utilizing single-emitter devices.

In the configuration as shown in FIG. 1, laser diodes $12_1$-$12_4$ are oriented "top down" so that top metallization layer $16_i$ of each laser diode $12_i$ faces its associated metallized contact area $14_i$ on submount 10. FIG. 2 illustrates the arrangement with the plurality of laser diodes $12_1$-$12_4$ attached to their separate (and electrically isolated) electrodes $14_1$-$14_4$ in a one-to-one relationship.

In accordance with the present invention, all of the individual laser diodes are ultimately supported by the single dielectric submount (substrate) 10, which performs as both a mechanical support for the laser diode structure as well as a heatsink that removes unwanted thermal energy from activated laser diodes. Inasmuch as each electrode $14_i$ is isolated from the other, the laser diodes will be isolated from each other as well and therefore may be separately energized and operated in any sequence appropriate for a particular application. The spacing $\Delta$ between each laser diode $12_i$ is thus a function of the spacing created between adjacent electrodes $14_i$ (as well as the limitations on the individual dimensions of each laser diode component). As a result of using the single submount, the configuration as shown in FIG. 2 provides for an increase in density (in terms of the number of separate laser diodes disposed within a specific area) over prior art arrangements where each single-emitter laser diode is disposed on its own separate submount, while also allowing for individual control of each of the laser diodes.

While using a single submount platform as shown in FIG. 2 allows for improvements in the ability to reduce the spacing between single-emitter laser diode structures, the need to individually place each laser diode on its own metallized contact area (as shown in FIGS. 1 and 2) can be time consuming and costly (and may result in optical misalignment of the emission areas of the individual laser diodes). A preferred embodiment of the present invention, as shown in FIGS. 3-5, addresses this concern by using an integrated laser structure containing an array of separate light emission areas instead of individual laser diodes as a starting point in the fabrication process.

Figure 3:
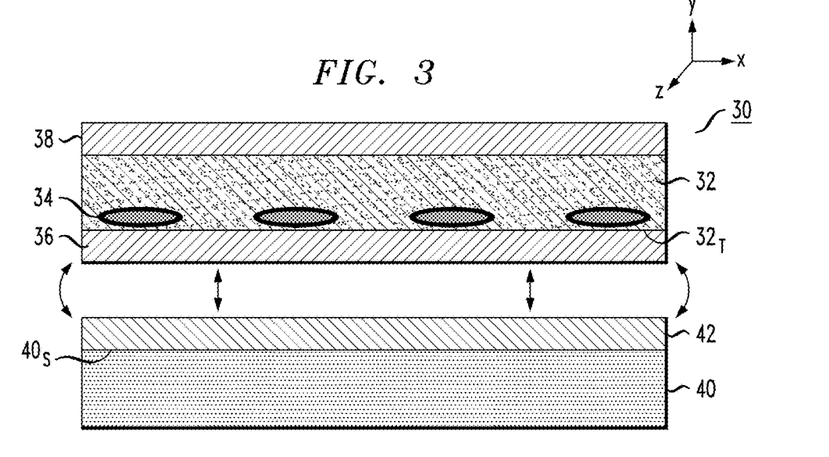
FIG. 3 shows an initial step of fabricating a densely-spaced collection of single-emitter laser diodes in accordance with the present invention, with FIG. 3 showing a laser bar (including a one-dimensional array of light emission areas) prior to bonding with a common submount structure.

Referring to FIG. 3, a laser bar 30 is shown as formed from a semiconductor structure 32 that is fabricated in a well-known manner to create a plurality of separate light emission regions 34 disposed along a defined axis of the structure (shown in the cut-away view of FIG. 3 as being along an x-axis direction). Semiconductor structure 32 is then processed to include a first metallization layer 36 formed on a top major surface $32_T$ of structure 32 (again, "top" with respect to the location of emission regions 34 within structure 32), and a second metallization layer 38 formed on a bottom major surface $32_B$ of structure 32.

Similar to the configuration described above, a single submount component 40 is used as a support substrate and heatsink in conjunction with laser bar 30. Again, it is preferred that submount 40 exhibit a CTE similar to that of laser bar 30. As shown in FIG. 3, a metallization (contact) layer 42 is disposed to cover a top surface 40S of submount 40.

Figure 4:
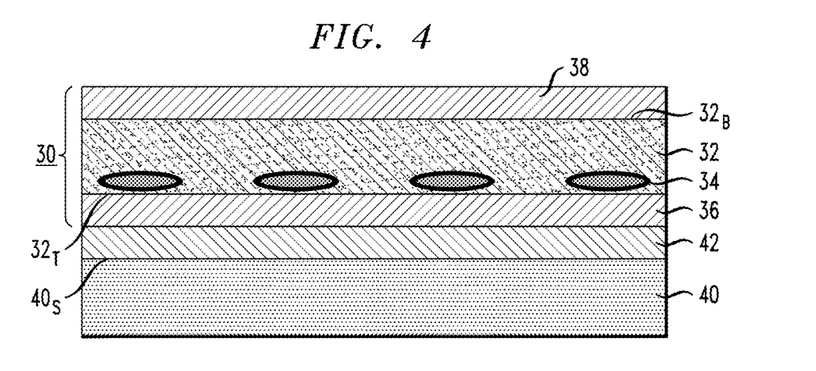
FIG. 4 shows the next step in this particular fabrication process, with the laser bar bonded to the common submount.
Figure 5:
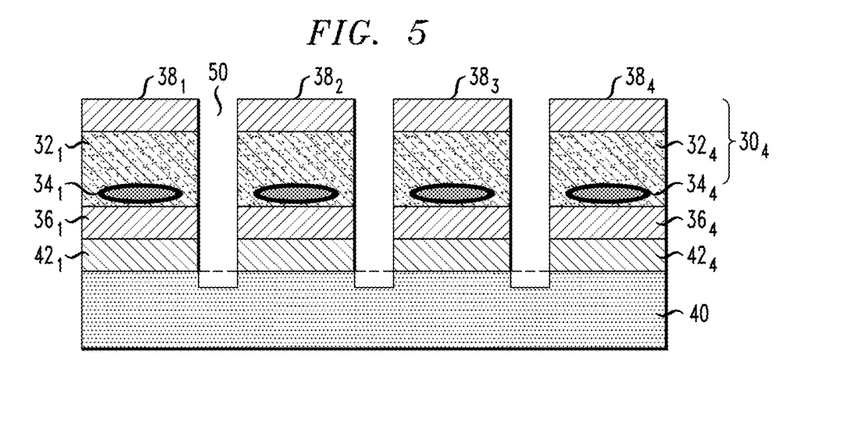
FIG. 5 illustrates the formation of densely-spaced single-emitter laser diodes by singulating the configuration of FIG. 4, forming a plurality of trenches through the thickness of the laser bar.

FIG. 4 illustrates the next step in this exemplary fabrication process, where laser bar 30 is attached to the exposed surface of metallization layer 42. The use of a single step to attach a plurality of separate emission regions 34 to the submount structure results in an arrangement where the individual diodes are automatically aligned with each other. Either one of the "top" or "bottom" metallization layers 36 or 38 can be attached to submount metallization layer 42, with top layer 36 preferred for embodiments where thermal issues are a concern (efficient transfer of heat from emission regions 34 through submount 40 and into an underlying cooling element). The attachment may be provided by gluing, brazing, etc, but preferably by soldering the two layers together. The material and method used to join together these components is chosen to provide good thermal and electrical conductivity, as well as to add mechanical structure to the configuration.

The required densely-spaced "single emitter" configuration of the present invention is then formed from the arrangement as shown in FIG. 4 by singulating the structure to physically separate the plurality of emitter regions 34 formed within laser bar 30. This step is shown in FIG. 5, where the singulation is created by forming a plurality of trenches 50 in spaced-apart locations across the structure. Trenches 50 may be formed by sawing, laser cutting, etching, etc, using well-known integrated circuit processing techniques to control the specific locations where the trenches are to be formed. In the case of sawing, the sawing would preferably be performed through bottom metallization layer 38, as shown in FIG. 5, and proceed through semiconductor material 32 and top metallization layer 36 (as well as passing through the solder or other bonding material used to join the components together).

The structure resulting from this singulation process results in a configuration essentially identical to that shown in FIG. 2, but with an improved degree of alignment accuracy by virtue of starting with an integrated laser structure having pre-aligned light emission areas.

It is possible to provide additional electrical isolation between adjacent laser diodes 30 by forming trenches 50 to extend beyond metallization layer 42 and into submount 40. FIG. 5 illustrates particular embodiment. The step of extending the trenches into the submount material eliminates the need for a structured metallization of the submount and the bond material (solder), as is required for the arrangement of FIG. 2.

Figure 6:
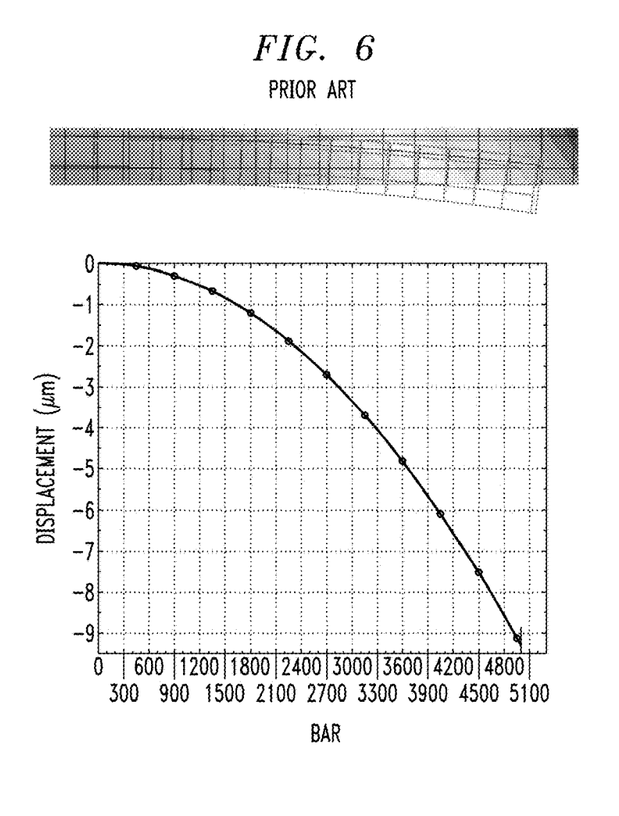
FIG. 6 is a plot of "bowing" associated with a prior art configuration of a laser bar bonded to a submount, the plot showing the displacement (from normal) along the length of the laser bar.

The creation of a singulated structure from an initial laser bar in accordance with this preferred embodiment of the present invention has been found to provide for the automatic alignment of the individual laser diodes to each other, while also significantly reducing the emission line misalignment (i.e., "bow" or any other type of wavy-line irregular mis-alignment) often found in prior art configurations using a laser bar. FIG. 6 is a plot of displacement in the emission line of an array of laser diodes formed within a laser bar of the prior art. Inasmuch as this structure is typically used as an array source where each diode is simultaneously illuminated and operated in parallel, there is no separation created between adjacent laser diodes. The displacement is measured in a direction vertical (y-axis) to the surface of the bar, and is shown for a 115 µm thick GaAs bar (CTE ~5.7×10$^{-6}$) attached to a 400 µm thick Cu$_{20}$W submount (CTE ~8.3×10$^{-6}$). The bow for the prior art configuration plotted in FIG. 6 is about 9.3 µm.

Figure 7:
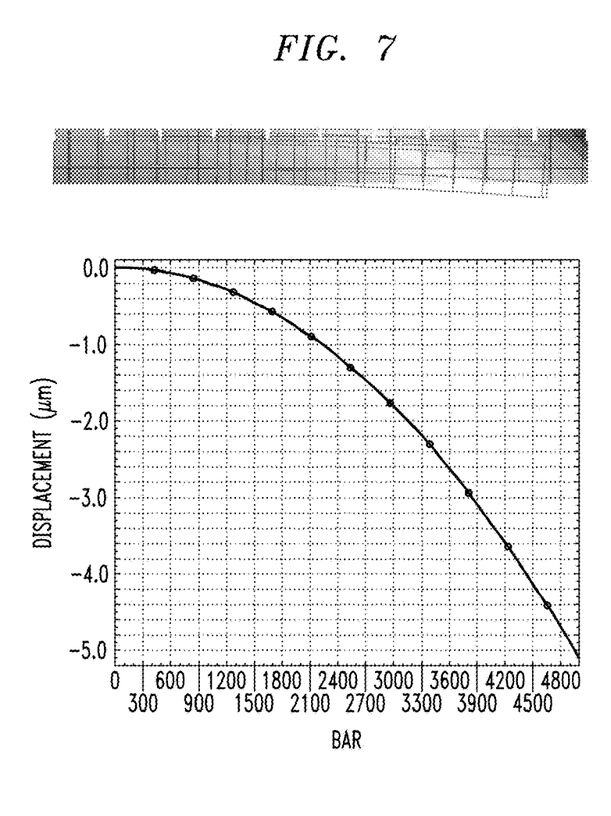
FIG. 7 is a plot of bowing associated with utilizing a singulated laser bar in accordance with the present invention, illustrating the reduction in bow achieved by using this configuration.

FIG. 7 is a plot for the inventive singulated laser bar configuration formed in accordance with the present invention. While using the same materials and dimensions as described above, the introduction of trenches to form a singulated structure is shown to significant reduce wafer bow. It is to be understood that the scale along the ordinate of this plot is half the value of the scale shown in FIG. 6. The decrease in bow, relative to the prior art plot of FIG. 6 is clearly shown. Indeed, for this exemplary embodiment of the present invention, the maximum bow for the singulated wafer is on the order of about 5.1 µm (compared to 9.3 µm).

As mentioned above, drawbacks in many of the prior art processes of attaching individual laser diodes or bars to submounts are associated with the sequential process flow required to complete the fabrication of the final assembly. For example, other elements to be included within a laser transmitter may need to be bonded or otherwise attached to the same submount as used to support the laser diode. However, any further heating of the submount (as required to bond another device) results in disturbing the alignment of the laser diode to the submount.

This problem is addressed in accordance with yet another embodiment of the present invention. In this case, the single-emitter laser diode structure and associated submount is created using a wafer-scale fabrication process.

Referring to the process described above with FIGS. 3-5, it can be shown that instead of using a longitudinal "segment" of semiconductor material and forming a laser bar, it is possible to fabricate an entire wafer of the single-emitter laser diode structures, and then bond that wafer to a second wafer that is utilized as the heatsinking submount (the submount wafer formed to include the overlying metallized contact layer). The wafer-to-wafer bonded arrangement can thereafter be diced into any desired configuration, including single laser diode devices (formed on a single submount), or a one-dimensional array of devices (as shown in FIG. 5), or even a two-dimensional (2D) array (i.e., a plane of separate laser diodes disposed on a single submount). In each case, the well-known wafer dicing process is used to form the desired array configuration (1D or 2D), and the trenching process described above used to provide singulation between the individual laser diodes within the array structure.

This type of fabrication is well-suited for vertical cavity surface emitting lasers (VCSELs), since the optical emission from the laser diode extends perpendicular to the light emission area. That is, since the emission extends in a direction perpendicular to the surface of the device that is diced (or cleaved), the dicing process does not affect the optical quality of the surface through which the light exits the device. However, for edge-emitting laser diodes, a mechanical process of sawing through the bonded wafer structure may adversely impact the quality of the optical surface (i.e., the facet) through which the signal exits. In this case, a set of steps as shown below in association with FIGS. 8-10 may be used to provide wafer-scale fabrication of edge-emitting singe-emitter laser diodes (and their associated submount structure) in accordance with the present invention.

Figure 8:
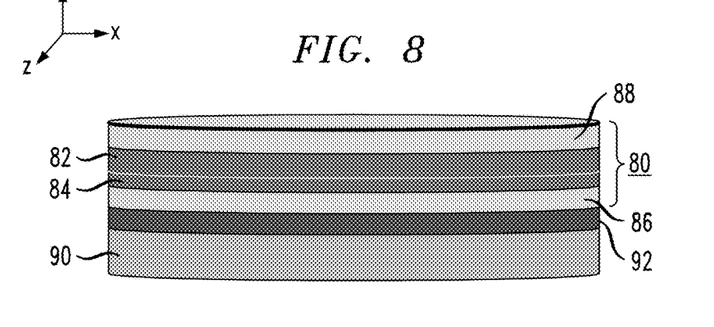
FIG. 8 shows an initial step of fabricating a densely-spaced collection of single-emitter laser diodes in accordance with the present invention, in this case utilizing a wafer-scale fabrication process.

Similar to the various embodiments described above, a wafer-based laser arrangement 80 is shown in FIG. 8 as comprising a semiconductor wafer 82 within which an active layer 84 is formed. In this case of edge emitting devices, the light output will ultimately exit from active layer 84 in a direction parallel to the z-x plane. A top metallization layer 86 disposed to cover a first major surface of wafer 82, and a bottom metallization layer 88 disposed to cover the opposing, second major surface of wafer 82.

As shown in FIG. 8, wafer-based laser arrangement 80 is attached to a submount wafer 90, and in particular is attached to a metallized contact layer 92 formed to cover a top major surface of submount wafer 90. In a preferred configuration of this embodiment, the CTE of submount 90 is relatively close to that of semiconductor wafer 82. This step is essentially the same as those described above to provide the initial attachment of the submount to the laser diode structure.

In this configuration where edge emitting devices are used, it is proposed to initiate the singulation process by forming trenches "upward" through the submount, instead of "downward" through the laser structure, as with the previous embodiments. This initial step is shown FIG. 9, where a plurality of trenches 90 are formed as shown to extend upward from a bottom surface 90B of submount wafer 90. As with trenches 50 described above, the placement and separation between the individual trenches 90 are dictated by the predetermined locations of the active regions of the edge emitting devices. The depth of trenches 90 is chosen to penetrate through the thickness of submount wafer 90, metallized contact layer 92 and, perhaps, also through a portion of metallization layer 86. The trenching process is controlled so that it is stopped prior to reaching semiconductor wafer 82. Thus, at this point in the process, there has not been any direct processing of the facet from which the edge emitting radiation will exit.

Figure 10:
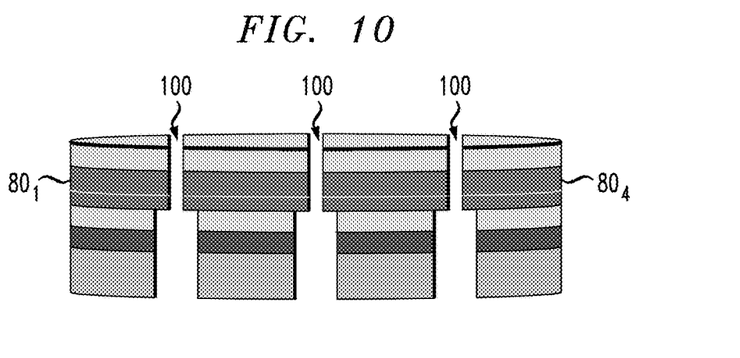
FIG. 10 shows a following step for this particular fabrication process, where the laser wafer is diced to separate the configuration into a desired grouping of densely-spaced laser devices.

The next step in the process, as shown in FIG. 10, is to define the separate laser emitter regions. Various well-known techniques may be used to perform this step (for example, etching or dicing through bottom metallization layer 88). The separations are denoted by reference numeral 100 in FIG. 10. Dicing along crystal planes may be preferred, since this process typically achieves the best results in terms of smooth surfaces in the emission areas. The dicing is performed either under an atmosphere or in a vacuum. Subsequent to the dicing, the emission area of the semiconductor device will be passivated and coated with films from dielectric and/or semiconductor material, as is well-understood, to create an optically smooth surface.

Figure 9:
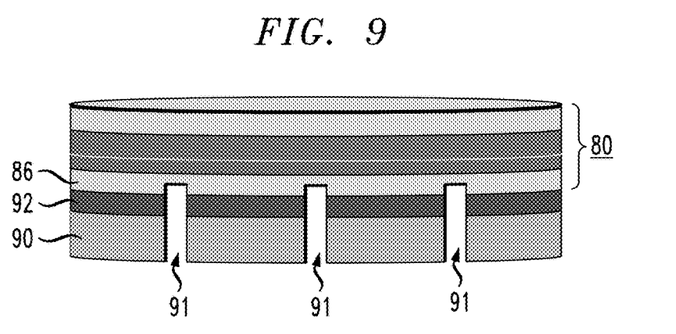
FIG. 9 illustrates a next step in an exemplary wafer-scale fabrication process, particularly well-suited for use with edge emitting laser diodes, with singulation trenches initially created from the backside of the structure (i.e., through the submount)
Figure 11:
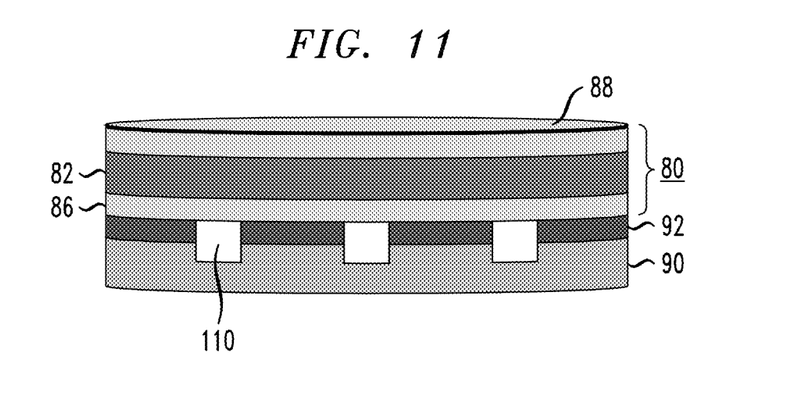
FIG. 11 illustrates an alternative processing step that may be used instead of creating trenches through the backside of the structure, in this case creating grooves through the top layer metallization of the submount wafer.
Figure 12:
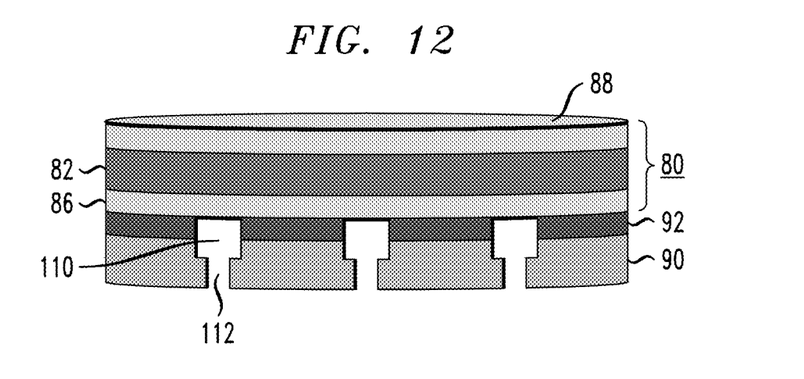
FIG. 12 shows a following processing step of bonding the laser-based wafer to the grooved submount as formed in FIG. 11.

FIGS. 11-12 illustrate an alternative to the portion of the process shown in FIG. 9. In this case, the combination of submount wafer 90 and metallized contact layer 92 is initially processed to create a plurality of grooves 110 that extend through metallized contact layer 92 and into the material forming submount wafer 90. As shown in FIG. 11, grooves 110 are shown as extending only through a portion of the thickness of submount wafer 90.

As shown in FIG. 11, laser-based wafer structure 90 is bonded to the grooved submount structure. The following step, shown in FIG. 12, creates trenches 112 through the backside of submount wafer 90. In this case, trenches 112 need only be deep enough to expose previously-made grooves 110. Once this step is completed, the processing as shown in FIG. 10 can be used to form the final densely-spaced configuration.

Various preferred embodiments of the present invention have been presented and explained in detail. However, it is to be understood that, without departing from the spirit or scope of the appended claims, various changes and modifications are possible.

What is claimed is:

1. An optical system including an array of densely-spaced light sources comprising
    a plurality of separate single-emitter laser diodes comprising an integrated laser structure including multiple emission areas, the multiple emission areas singulated by a plurality of trenches to form the plurality of separate single-emitter laser diodes; and
    a common submount comprising a substrate of heatsinking material and a plurality of separate metallization regions disposed in a densely-spaced configuration along a top surface of the substrate, each separate single-emitter laser diode disposed over and contacted to a separate one of the plurality of separate metallization regions and forming the array of densely-spaced light sources supported on the common submount, the plurality of trenches extending into a portion of the substrate and providing isolation between adjacent single-emitter laser diodes while maintaining the common submount configuration for the array.

2. The optical system as defined in claim 1 wherein the plurality of separate metallization regions is formed as a single layer of metal, with the plurality of trenches extending downward through the single layer of metal to form the separate metallization regions.

3. The optical system as defined in claim 1 wherein the integrated laser structure comprises a one-dimensional array of separate light emission areas.

4. The optical system as defined in claim 1 wherein the integrated laser structure comprises a wafer-based configuration including a two-dimensional array of separate light emission areas.

5. The optical system as defined in claim 1 wherein a coefficient of thermal expansion (CTE) of the common submount is substantially similar to a CTE of the integrated laser structure.

6. The optical system as defined in claim 1 where the integrated laser structure comprises a GaAs-based structure.

7. The optical system as defined in claim 6 where the common submount is selected to exhibit a CTE in the range of $3 \times 10^{-6}$ to $10 \times 10^{-6}$.

8. The optical system as defined in claim 7 wherein the common submount comprises $Cu_{20}W$.

9. A method of forming an array of densely-spaced single-emitter laser diodes supported by a single submount, comprising the steps of:
    a) providing an integrated laser structure including an array of light emission areas defining the array of densely-spaced single-emitter laser diodes;
    b) providing a heatsinking common submount including a top metallization contact layer disposed as a covering layer over a substrate;
    c) attaching the integrated laser structure to the top metallization contact layer of the heatsinking common submount; and
    d) singulating through the integrated laser structure and top metallization contact layer of the arrangement created in step c) to separate the light emission areas and form the array of densely-spaced single-emitter laser diodes on the heatsinking common substrate.

10. The method as defined in claim 9 wherein in performing step a), a laser diode bar including a one-dimensional array of light emission areas is provided.

11. The method as defined in claim 9 wherein in performing step a), a wafer structure including a two-dimensional array of light emission areas is provided.

12. The method as defined in claim 9 wherein in performing step b), a heatsinking common submount exhibiting a CTE similar to the integrated laser structure is provided.

13. The method as defined in claim 9 wherein in performing step c), the integrated laser structure is soldered to the top metallization contact layer of the heatsinking common submount.

14. The method as defined in claim 9 wherein in performing step d), a plurality of vertical trenches is formed downward through the integrated laser structure and the top metallization contact layer to provide the singulation.

15. The method as defined in claim 14 wherein in performing step d), the plurality of vertical trenches is formed to extend into a portion of the substrate and further isolate individual laser diodes while maintaining a common substrate for the array structure.

16. The method as defined in claim 14 wherein the plurality of vertical trenches is formed by sawing through the integrated laser structure.

17. The method as defined in claim 14 wherein the plurality of vertical trenches is formed by etching through the integrated laser structure.

18. The method as defined in claim 9 wherein in performing step d), the following steps are performed:
    d1) forming a plurality of vertical trenches upwards through the substrate and the top metallization contact layer; and d2) dicing through the integrated laser structure to define the array of light emitting regions for the array of laser diodes.

19. The method as defined in claim 18 wherein in performing step a), a plurality of edge-emitting laser diodes is provided and subsequent to step d2), performing the following:

passivating light emitting edge regions created in step d2).

* * * * *